United States Patent [19]
Bevk et al.

[11] Patent Number: 5,851,922
[45] Date of Patent: Dec. 22, 1998

[54] PROCESS FOR FABRICATING A DEVICE USING NITROGEN IMPLANTATION INTO SILICIDE LAYER

[75] Inventors: Joze Bevk, Summit, N.J.; Matthias Werner Fuertsch, Gomaringen, Germany; George E. Georgiou, Gillette; Steven James Hillenius, Summit, both of N.J.

[73] Assignee: Lucent Technologies Inc., Murray Hill, N.J.

[21] Appl. No.: 865,548

[22] Filed: May 29, 1997

Related U.S. Application Data

[63] Continuation of Ser. No. 557,761, Nov. 13, 1995, abandoned.

[51] Int. Cl.[6] .................................................. H01L 21/76
[52] U.S. Cl. ........................ 438/655; 438/660; 438/659; 257/755
[58] Field of Search .................... 438/200, 655, 438/660, 659; 257/371, 755

[56] References Cited

U.S. PATENT DOCUMENTS

| 4,435,896 | 3/1984 | Parillo et al. | 29/571 |
|---|---|---|---|
| 4,716,126 | 12/1987 | Cogan | 437/24 |
| 5,108,953 | 4/1992 | Tateiwa | 437/200 |
| 5,247,198 | 9/1993 | Homma | 257/371 |
| 5,278,096 | 1/1994 | Lee et al. | 437/162 |
| 5,316,977 | 5/1994 | Kunishima et al. | 437/160 |
| 5,320,974 | 6/1994 | Hori et al. | 437/200 |
| 5,372,951 | 12/1994 | Anjum et al. | 437/24 |
| 5,480,828 | 1/1996 | Hsu et al. | 437/24 |
| 5,504,031 | 4/1996 | Hsu et al. | 437/160 |
| 5,508,212 | 4/1996 | Wang et al. | 437/24 |

FOREIGN PATENT DOCUMENTS

| 63-204743 | 8/1988 | Japan | 437/24 |
|---|---|---|---|
| 2-207549 | 8/1990 | Japan . | |

OTHER PUBLICATIONS

Wolf, S. and R.N. Tauber, Silicon Processing for the VLSI Era, vol. 1 : Process Technology, Lattice Press, Sunset Beach, CA, pp. 305–307. 1986.

"A Low Cost Approach for Sub–0.25 m Low Voltage CMOS", Singer, P., Semiconductor International, p. 32 (Nov. 1995).

*Primary Examiner*—Olik Chaudhuri
*Assistant Examiner*—Kurt Eaton
*Attorney, Agent, or Firm*—Richard J. Botos; Scott J. Rittman

[57] ABSTRACT

The invention is directed to a process for forming $p^+$ and $n^+$ gates on a single substrate. A polycrystalline silicon or amorphous silicon layer is formed on a substrate with n-type and p-type regions formed therein and with a layer of silicon dioxide formed thereover and the structure is subjected to a low temperature anneal. A layer of metal silicide is then formed over the structure and n-type and p-type dopants are implanted into the resulting structure. A nitrogen implant is performed after the n-type dopant is implanted into the structure. The nitrogen implant reduces the amount to which the p-type dopant diffuses through the silicide layer and into the $n^+$ gates. A dielectric material is then formed over the structure and patterned, after which the structure is subjected to additional processing steps to form gate stacks over the n-regions and the p-regions of the substrate.

12 Claims, 3 Drawing Sheets

PROCESS FOR FABRICATING A DEVICE USING NITROGEN IMPLANTATION INTO SILICIDE LAYER

This application is a continuation of application Ser. No. 08/557,761, filed on Nov. 13, 1995, now abandoned.

BACKGROUND OF THE INVENTION

Technical Field

This invention relates to a process for fabricating integrated circuits.

Technical Background

Many CMOS (Complimentary Metal Oxide Semiconductor) integrated circuits utilize $n^+$ gate material for both PMOS and NMOS devices. However, as gate lengths shrink and operating voltages decrease below 2.5 V(e.g., in low-power devices for portable electronics), there is an increasing trend to the use of $p^+$ gates for PMOS devices. $P^+$ gate PMOS transistors (i.e., surface channel devices) exhibit good short channel performance, threshold voltages, and sub-threshold swings which are less dependent upon channel length than PMOS devices with $n^+$ gates (i.e., buried channel devices).

Typically, $p^+$ gates are formed by depositing a polysilicon layer which is then doped. The polysilicon is typically doped with boron or $BF_2$. However, if the polysilicon is doped by ion implantation with boron, the dopant species (boron) may penetrate through the polysilicon (a phenomenon termed "chanelling") into the substrate and cause changes in the threshold voltage. If the polysilicon is doped with $BF_2$ (a larger species) channeling is less likely to occur. However, the presence of fluorine in the polysilicon seems to enhance boron diffusion through the gate oxide into the substrate during subsequent thermal treatments. Thus, the threshold voltage is again adversely affected.

$N^+$ gates are typically formed from polysilicon doped with phosphorous or arsenic. Since both phosphorous and arsenic atoms are bigger than boron atoms, channeling is a less serious problem for devices with $n^+$ gates (assuming that the same thickness of polysilicon is employed).

In CMOS devices with a dual-gate structure ($p^+$ polysilicon for PMOS and $n^+$ polysilicon for NMOS) dopant channeling during ion implantation is not the only potential problem. Boron, in particular, has a tendency to diffuse from the $p^+$ polysilicon layer through the thin, underlying gate oxide into the channel region during thermal annealing steps subsequent to implantation. This tendency is exacerbated by fluorine. Also, in gate configurations employing metal silicides, both n-type and p-type dopants have a tendency to diffuse laterally, which can cross-dope the gates of adjacent devices and large, unacceptable shifts in device threshold voltage can result.

One solution to the problem of channeling is to increase the thickness of the gate polysilicon material. Gates with polysilicon thicknesses of roughly 3600 Å often have acceptable resistance to channeling for currently-used implantation energies. However, gates of such thickness create topology which makes subsequent processing difficult.

Some manufacturers of comparatively thin $n^+$ gates cover the polysilicon with tungsten silicide and then with a silicon dioxide layer to reduce the amount of dopant channeling. The silicon dioxide layer is formed at temperatures that are potentially high enough to cause crystallization of the tungsten silicide. After the silicon dioxide is formed, the gate is implanted with an n-type dopant such as phosphorous.

U.S. Pat. No. 5,278,096 to Lee et al. suggests introducing the boron into a dielectric layer formed over the silicide with sufficient energy to implant the underlying silicide with the boron. As illustrated in FIG. 1, a silicon substrate 10 has formed thereover sequential layers of oxide 12, undoped polysilicon 14, tungsten silicide 18 and, optionally, a dielectric layer 20 (e.g. PETEOS, PECVD nitride, low temperature oxide, or spin-on-glass ). Lee et al. introduces the $p^+$ dopant 23 directly into the silicide layer 18 or, if present, the overlying dielectric layer 20. An annealing step is performed to drive the dopant 23 into the underlying polysilicon layer 14. In an extension of this process, Yu, D. C. H., et al., "Novel $n^+/p^+$ Dual-Gate Surface-Channel CMOS Device Fabrication and Characterization," 1994 IEDM Technical Digest, page 489 (1994) form a titanium nitride (TiN) shunt layer over the doped silicide. The Yu et al. process requires additional masking steps to etch away the $WSi_x$-polycide in the $n^+/p^+$ interface area and to form the TiN shunt. Such steps are not required by conventional dual gate CMOS processing. Although the process suggested by Yu et al. controls both the amount to which the $p^+$ dopant diffuses into the $n^+$ gate area and vice versa during subsequent annealing steps, a simpler process is desired.

SUMMARY OF THE INVENTION

In the process of the present invention, CMOS devices are fabricated by forming a layer of amorphous or polycrystalline silicon (polysilicon hereinafter) over a thin (e.g. 100 Å or less) gate oxide layer which has been previously formed over n and p regions of a semiconductor substrate. Typically the substrate is a silicon substrate. It is advantageous if the substrate is annealed in an inert atmosphere at a low temperature that does not exceed about 700° C. for at least about three hours after the polysilicon layer is formed over the substrate to recrystallize the polysilicon layer. Recrystallation time and temperature are selected depending upon the thickness of the layer, and one skilled in the art is able to select the appropriate conditions for recrystallization.

A layer of a refractory metal silicide is then formed over the polysilicon. A mask is formed over the metal silicide layer using standard lithographic techniques to selectively expose portions of the metal silicide layer overlying the p-type regions of the substrate. An n-type dopant is implanted into the exposed portions of the metal silicide layer using standard implant energy and standard dopant concentrations. Arsenic and phosphorous are examples of suitable n-type dopants. The exposed portions of the metal silicide layer are then subjected to a nitrogen implant. A nitrogen dose of at least about $5\times10^{14}$ atoms/$cm^2$ is introduced into the exposed portions of the metal silicide layer. The dose of both n-type dopant and nitrogen is largely a matter of design choice and depends upon considerations such as the thickness of the formed polysilicon layer, i.e. lower doses within the range specified herein are used for thinner polysilicon layers within the range of thicknesses specified herein, and other parameters that affect device performance. Generally, the dosage of n-type dopant is in the range of about $1\times10^{15}$/$cm^2$ to about $5\times10^{15}$/$cm^2$. The mask is then removed, again using standard processing techniques, and a second mask is formed over the metal silicide layer. Portions of the metal silicide layer overlying the n-type region of the substrate are then exposed through a portion or portions of the mask. A p-type dopant (e.g. B or $BF_2$) is then introduced into the exposed portions of the metal silicide layer.

Devices are then formed on the wafer using conventional processing techniques that are well known to one skilled in the art. However, it is advantageous, in subsequent thermal annealing steps, for high temperature rapid thermal annealing steps (i.e. steps during which the substrate on which the devices are being formed is subjected to temperatures in excess of about 1000° C. for times less than about 1 minute) not to be proceeded or followed by furnace annealing at temperatures in excess of about 750° C. Prior to rapid thermal annealing, a furnace anneal above about 750° C. will increase lateral diffusion of both n-type and p-type dopant before a rapid thermal annealing step. After rapid thermal annealing, a furnace anneal above about 750° C. will reduce the activation level of the p-type dopant in the polysilicon layer.

DETAILED DESCRIPTION

Figure 2A:
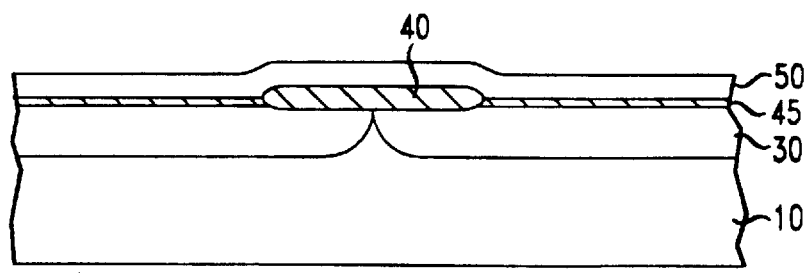
FIG. 2A–2D are cross-sectional views used to illustrate the processing sequence of the present invention.
Figure 2B:
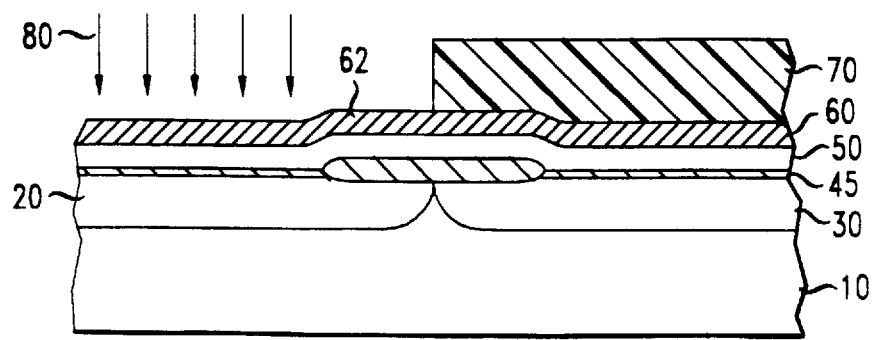
Figure 2C:
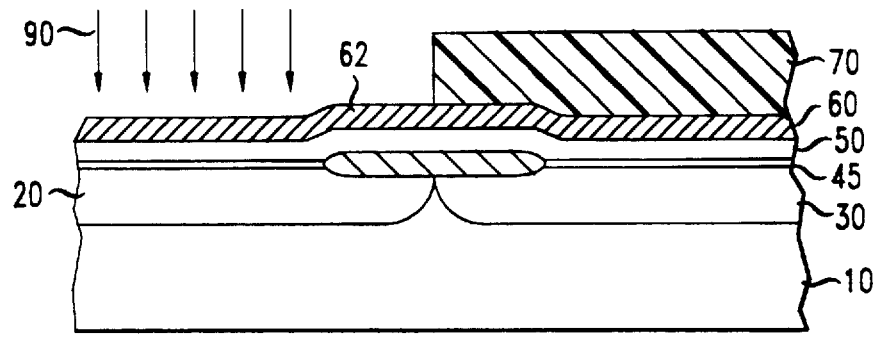

The process of the present invention is illustrated in FIGS. 2A through 2C. CMOS devices are fabricated by forming p-regions 20 and n-regions 30 in a semiconductor substrate 10. Typically the substrate 10 is a silicon substrate. The n-type and p-type regions of the substrate are formed using standard processing techniques well known to one skilled in the art such as the twin tub process described in U.S. Pat. No. 4,435,896 to Parillo et al., which is hereby incorporated by reference.

Field oxide 40 isolates the n-type region 30 and the p-type region 20 at the surface of the substrate 10. The field oxide 40 is formed on the substrate using standard techniques such as furnace oxidation that are well known to one skilled in the art. Typically, the field oxide has a thickness of about 2000 Å to about 4000 Å. After the formation of the field oxide layer 40, a thin gate oxide layer 45 is formed over exposed portions of the silicon substrate 10. It is advantageous if the thin gate oxide layer is at least 50 Å thick. The thin gate oxide layer 45 is formed using standard processing techniques.

A layer of amorphous silicon or polysilicon 50 is then formed over the substrate surface. Typically, the layer 50 has a thickness of about 20 nm to about 300 nm. It is advantageous if the polysilicon layer has a thickness of about 50 nm to about 100 nm. The minimum thickness is specified to provide film uniformity and to meet the patterning requirements for forming gate stacks. Conditions for forming amorphous silicon or polysilicon on oxidized silicon substrates are well known to one skilled in the art.

After the layer 50 has been formed on the oxidized substrate surface, it is advantageous if the substrate is annealed in a nitrogen atmosphere at a low temperature that does not exceed 700° C. for at least about three hours to recrystallize the amorphous silicon or polysilicon. Other conventional techniques for recrystallization are contemplated as suitable, however it is preferred that the recrystallization take place at temperatures less than about 700° C. to avoid excessive surface roughness. As illustrated in FIG. 2B, a layer of a refractory metal silicide 60 is then formed over the polysilicon. Examples of suitable metal silicide materials include tungsten silicide, tantalum silicide, and cobalt silicide. The metal silicide is typically formed by sputtering at a temperature in the range of about room temperature to about 400° C. The sputtering process produces a comparatively amorphous layer which does not exhibit crystalline grains which can promote channeling of later-implanted dopants. Generally, the metal silicide layer 60 has a thickness in the range of about 300 Å to about 3000 Å. It is advantageous if the thickness of layer 60 is about 1000 Å to about 2000 Å because of the conductance provided by layers with thicknesses within this range. Other conventional expedients such as chemical vapor deposition (CVD) are also contemplated as suitable for forming the metal silicide layer.

A mask 70 is formed over the metal silicide layer 60 using standard lithographic techniques to selectively expose portions of the metal silicide layer 60 overlying the p-type regions 20 of the substrate 10. An n-type dopant 80 is implanted into the exposed portions 62 of the metal silicide layer 60 using standard implant energy and standard dopant concentrations. Arsenic is one example of a suitable n-type dopant. As illustrated in FIG. 2C, the exposed portions 62 of the tungsten silicide layer 60 are then subjected to a nitrogen implant 90. A nitrogen dopant concentration of at least about $5 \times 10^{14}$ atoms/cm$^2$ is introduced into the exposed portions of the metal silicide layer. The actual dopant concentration is a matter of design choice, but it is advantageous if the dopant concentration is about $1 \times 10^{15}$ atoms/cm$^2$ to about $5 \times 10^{15}$ atoms/cm$^2$.

Figure 2D:
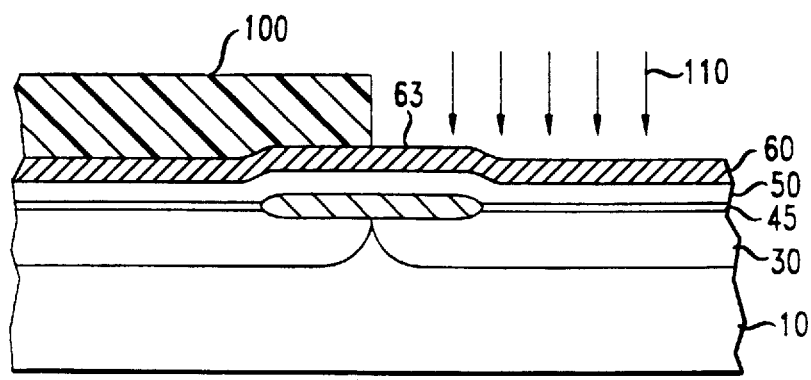

The mask 70 is then removed, again using standard techniques for removing photoresist masks, and, as illustrated in FIG. 2D a second mask 100 is formed over the metal silicide layer 60. The portion 63 of the metal silicide layer 60 overlying the n-type region 30 of the substrate 10 is then exposed through a portion or portions of the mask 100. A p-type dopant 110 is then introduced into the exposed portion 63 of the metal silicide layer 60. Typically, the p-type dopant is boron or BF$_2$. The dopant conditions are chosen to confine virtually all of the implant dose in the silicide layer. Exemplary conditions for BF$_2$ implantation are 25 KeV at a dosage of $4 \times 10^{15}$ atoms/cm$^2$. After the boron is implanted, the photoresist 100 is removed using standard processing techniques.

Figure 1:
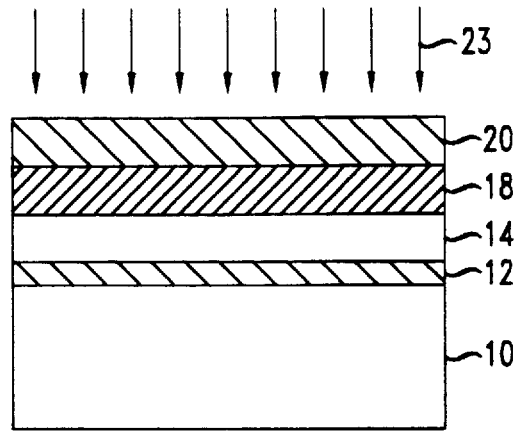
FIG. 1 is a cross-sectional view that illustrates the sequence of processing steps in the prior art process.

The resulting structure is then subjected to a processing sequence that typically includes the formation of dielectric layer over the silicide layer (FIG. 1) and other processing steps to form gate stacks over the n-regions and p-regions of the substrate. The dielectric layer is any dielectric material formed at a sufficiently low temperature to prevent cross-diffusion of the dopant through the metal silicide layer. Examples of suitable dielectric layer materials include an oxide layer formed by the plasma-enhanced deposition of TEOS (PETEOS) and a nitride layer formed by plasma-enhanced chemical vapor deposition (PECVD nitride). The dielectric layer can also be a layer of spin-on glass (SOG).

The following example further illustrates the process of the present invention.

EXAMPLE 1

Silicon wafers were processed using conventional expedients, well known to one skilled in the art, to form lightly doped n-type and p-type regions in the substrate. A 3,300 Å-thick region of field oxide was grown on selected portions of the wafers to electrically isolate the n-type regions from the p-type regions. A 60 Å-thick layer of silicon dioxide gate dielectric was then grown on the portions of the wafer not masked by the field oxide by subjecting the wafers to dry oxygen at 800° C. for 40 minutes in an oxidation furnace. Some wafers were placed in a low pressure CVD (LPCVD) furnace operated at 550° C. for a time sufficient to grow 80 nm-thick layers of amorphous silicon thereon. Other wafers were placed in an LPCVD furnace operated at 620° C. for a time sufficient to grow 80 nm-thick layers of polycrystalline silicon thereon. The wafers were then annealed in a nitrogen atmosphere at 650° C. for five hours to recrystallize the silicon. A 120 nm-thick layer of tungsten silicide ($WSi_x$) was formed on the recrystallized silicon wafers by sputter deposition. The variable "x" is used because the sputter-deposited tungsten silicide is silicon-rich, i.e., x is greater than 2. The sputter deposition was done in an argon atmosphere at a pressure of 12 microns of Hg using a $WSi_{2.85}$ target. The wafers were maintained at a temperature of 400° C. during sputtering. The $WSi_x$ layer formed under these conditions was amorphous.

A layer of photoresist was then formed on the structure and patterned to expose portions of the structure surface overlying the lightly doped p-type region of the substrate. A conventional photoresist and conventional lithographic techniques were used for this purpose. The exposed portions of the structure were then implanted with arsenic at 50 KeV and dosage of $4 \times 10^{15}$ atoms/cm$^2$. The exposed portions were then subjected to a nitrogen implant at 30 KeV and a dose of $3 \times 10^{15}$ atoms/cm$^2$. The photoresist was then removed and a second photoresist mask was formed on the layered structure. This time, portions of the structure surface overlying the lightly n-doped regions of the substrate were exposed through the resist mask.

The exposed portions of the structure were implanted either with $BF_2$ at a dose of $4 \times 10^{15}$ atoms/cm$^2$ at 25 KeV or with the same dosage of boron at 10 KeV. The photoresist was then stripped and a 1000 Å-thick layer of oxide was formed on the surface of the structure by the plasma decomposition of TEOS, using standard techniques. Devices were then formed using conventional processing techniques well known to one skilled in the art. The threshold voltage shifts of these devices were then measured using the a technique described in Parillo, L., et al., "A Fine Line CMOS Technology That Uses P+ Polysilicon Gates For NMOS and PMOS Devices," *IEDM Technical Digest*, p. 418 (1984) which is hereby incorporated by reference. Devices were also prepared by a process in which the low temperature annealing step and the nitrogen implant step were eliminated. This process for device fabrication is disclosed in Takehuci, K., et al., "High Performance Sub-tenth Micron CMOS Using Advanced Boron Doping and $WSi_2$ Dual Gate Process," *Symposium on VLSI Technology*, p. 9 (1995), which is hereby incorporated by reference.

Figure 3:
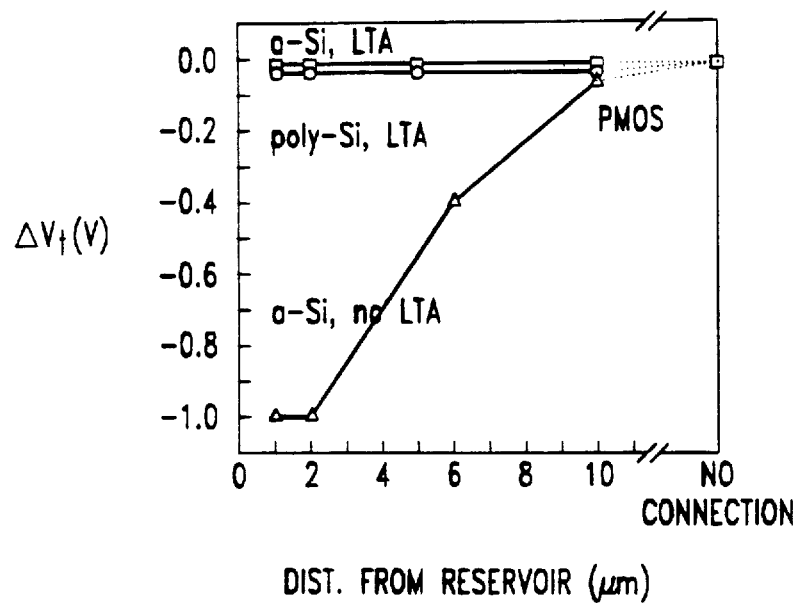
FIG. 3 compares the threshold voltage shifts of PMOS devices made using the process of the present invention with the threshold voltage of devices made using a process without a low temperature anneal step.
Figure 4:
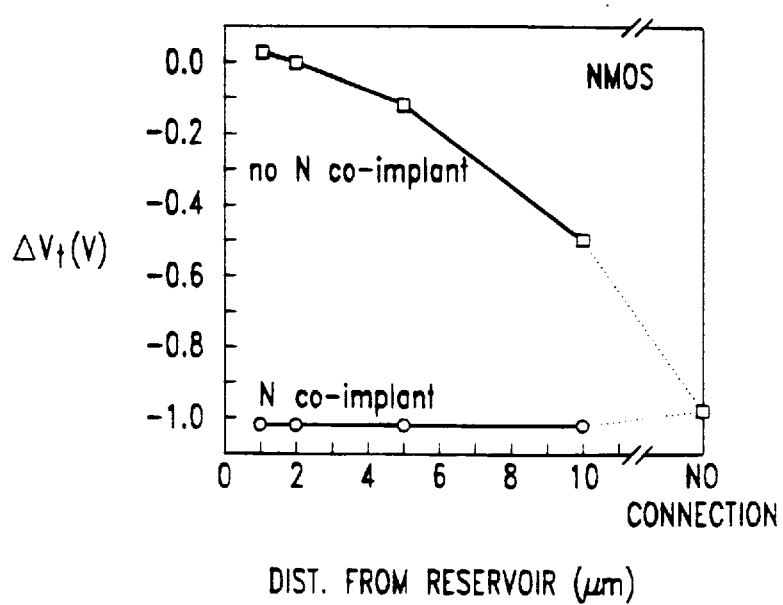
FIG. 4 compares the threshold voltage of NMOS devices made using the process of the present invention with the threshold voltage of devices made using a process in which the low temperature anneal step and the nitrogen implant step were omitted.

The threshold shift for the devices made according to this process was measured as described above. As illustrated in FIG. 3, the threshold voltage shifts for PMOS devices with either an amorphous silicon layer or a polyscrystalline silicon layer that were subjected to the low temperature anneal prior to silicide layer formation were much smaller than the threshold voltage shifts for devices that were formed by a process that did not subject the wafers to a low temperature anneal after the polysilicon (either amorphous or polycrystalline) was formed thereon. The difference in threshold voltage shifts between PMOS devices formed using the process of the present invention and PMOS devices formed using a process without a post-polysilicon formation low temperature anneal was greatest a distance less than 10 microns from the reservoir of n-type dopant in the metal silicide. Similarly, as illustrated in FIG. 4, NMOS devices that were subjected to the nitrogen co-implant had a considerably lower threshold voltage than the NMOS devices that were formed by a process that did not have a nitrogen co-implant. Again, this difference was especially great a distance of 10 microns or less from the reservoir of p-type dopant in the metal silicide. Consequently, the process of the present invention provides PMOS and NMOS devices with lower threshold voltage shifts than PMOS and NMOS devices that are formed using other processes.

The invention claimed is:

1. A process for device fabrication comprising:

forming a layer of dielectric material on a silicon substrate with n-type and p-type regions therein;

forming a silicon layer of amorphous or polysilicon over the dielectric layer;

forming a refractory metal silicide layer over said amorphous or polysilicon layer;

directing an n-type dopant species at a first portion of the refractory metal silicide layer thereby causing the n-type dopant species to implant in the silicide;

directing a nitrogen dopant at the first portion of the refractory metal silicide layer thereby causing the nitrogen dopant species to implant in the silicide;

directing a p-type dopant at a second portion of the refractory metal silicide layer thereby causing the p-type dopant species to implant in the silicide; and performing an anneal at a temperature that is sufficient to cause at least some of both the n-type dopant and the p-type dopant to migrate from the silicide layer to the underlying layer of amorphous silicon or polysilicon, wherein the nitrogen dopant reduces diffusion of the p-type dopant in the first portion of the refractory metal silicide layer.

2. The process of claim 1 further comprising annealing the substrate after the layer of amorphous silicon or polysilicon is formed thereon but prior to the formation of the refractory metal silicide layer at a temperature not to exceed about 700° C.

3. The process of claim 1 in which the p-type dopant contains boron and is selected from the group consisting of B and $BF_2$.

4. The process of claim 1 wherein the refractory metal silicide is selected from the group consisting of tungsten silicide, tantalum silicide, and cobalt silicide.

5. The process of claim 4 wherein the refractory metal silicide is formed by sputtering.

6. The process of claim 1 wherein the thickness of the silicon layer is about 200 Å to about 3000 Å.

7. The process of claim 2 wherein the substrate is annealed for a time period less than about five hours.

8. The process of claim 1 wherein the n-type dopant is selected from the group consisting of arsenic and phosphorous.

9. The process of claim 1 wherein at least a portion of the dielectric layer overlying the p-type and n-type regions of the substrate has a thickness of about 100 Å or less.

10. The process of claim 6 wherein the thickness of the silicon layer is about 500 Å to about 1000 Å.

11. The process of claim 4 wherein the thickness of the metal silicide layer is about 300 Å to about 3000 Å.

12. The process of claim 4 wherein the thickness of the metal silicide layer is about 1000 Å to about 2000 Å.

* * * * *